(12) United States Patent  
Tai

(10) Patent No.: US 7,088,610 B2
(45) Date of Patent: Aug. 8, 2006

(54) MAGNETIC MEMORY APPARATUS AND METHOD OF MANUFACTURING MAGNETIC MEMORY APPARATUS

(75) Inventor: Kaori Tai, Kanagawa (JP)

(73) Assignee: Sony Corporation (JP)

( * ) Notice: Subject to any disclaimer, the term of this patent is extended or adjusted under 35 U.S.C. 154(b) by 196 days.

(21) Appl. No.: 10/854,215

(22) Filed: May 27, 2004

(65) Prior Publication Data
US 2005/0030821 A1    Feb. 10, 2005

(30) Foreign Application Priority Data
Jun. 6, 2003    (JP) .......................... P2003-161451

(51) Int. Cl.
*G11C 11/00*    (2006.01)
(52) U.S. Cl. ...................... 365/158; 365/171; 365/173
(58) Field of Classification Search .................... None
See application file for complete search history.

(56) References Cited

U.S. PATENT DOCUMENTS

| | | | |
|---|---|---|---|
| 5,940,319 | A | 8/1999 | Durlam et al. |
| 6,555,858 | B1 | 4/2003 | Jones et al. |
| 6,724,651 | B1 * | 4/2004 | Hirai .......................... 365/158 |

OTHER PUBLICATIONS

Wang, et al., "Feasibility of Ultra-Dense Spin-Tunneling Random Access Memory", IEEE Transaction on Magnetics 33 [6], Nov. 1997, p. 4498-4512.
R. Scheuerlein et al, "TA7.2 A 10ns Read and Write Non-Volatile Memory Array Using a Magnetic Tunnel Junction and FET Switch in each Cell", 2000 IEEE International Soild-State Circuits Conference Digest of Papers (Feb. 2000) p. 129-129.
EPO Search Report mailed Mar. 30, 2005.

* cited by examiner

*Primary Examiner*—David Lam
(74) *Attorney, Agent, or Firm*—Rader, Fishman & Grauer PLLC; Ronald P. Kananen

(57) ABSTRACT

A magnetic memory apparatus including a memory cell region and a peripheral circuitry region mounted on a substrate is provided. The memory cell region includes first wiring, second wiring that three-dimensionally intersects with the first wiring, and a magnetoresistance effect type memory device disposed in an intersecting region of the first and the second wiring for storing and reproducing information of a magnetic spin. The peripheral circuitry region includes first wiring that is in the same wiring layer as that of the first wiring in the memory cell region, and second wiring that is in the same wiring layer as the second wiring in the memory cell, and a magnetic material layer including a high magnetic permeability layer is formed on both side surfaces of the first wiring only within the memory cell region and on a surface opposite to a surface facing the memory device.

4 Claims, 6 Drawing Sheets

FIG.2
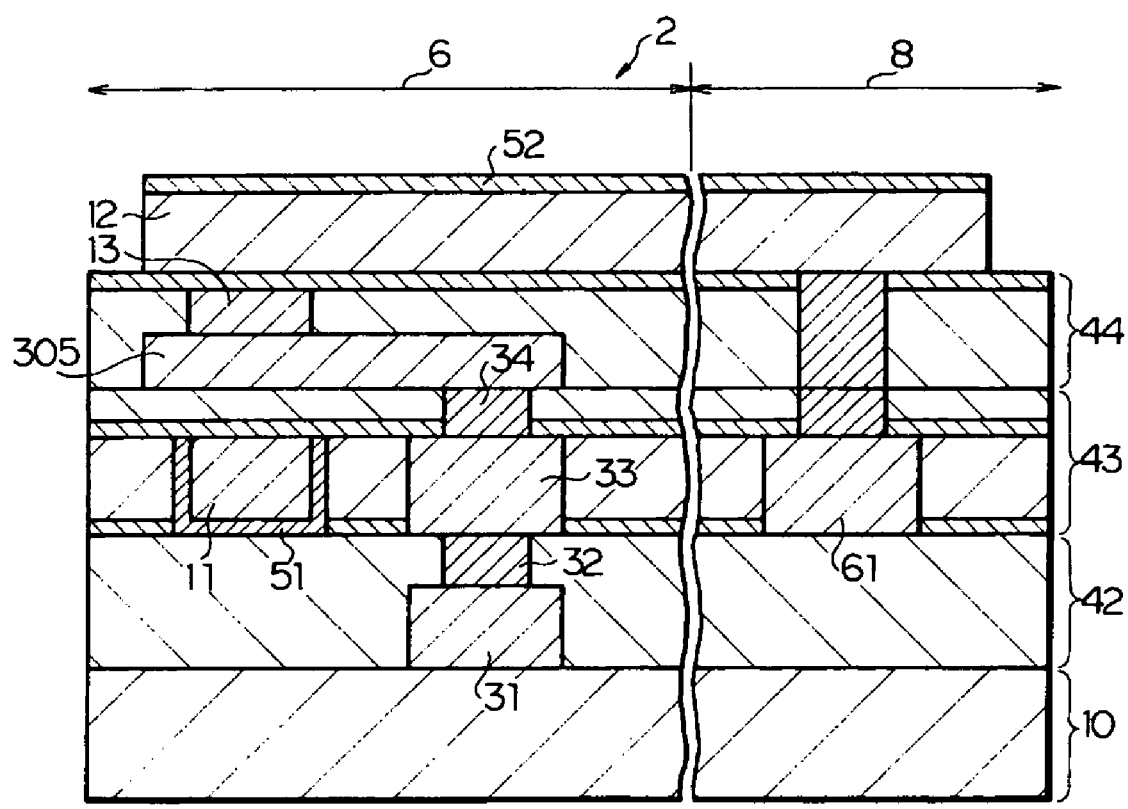
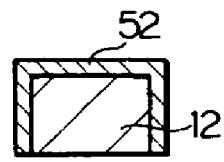

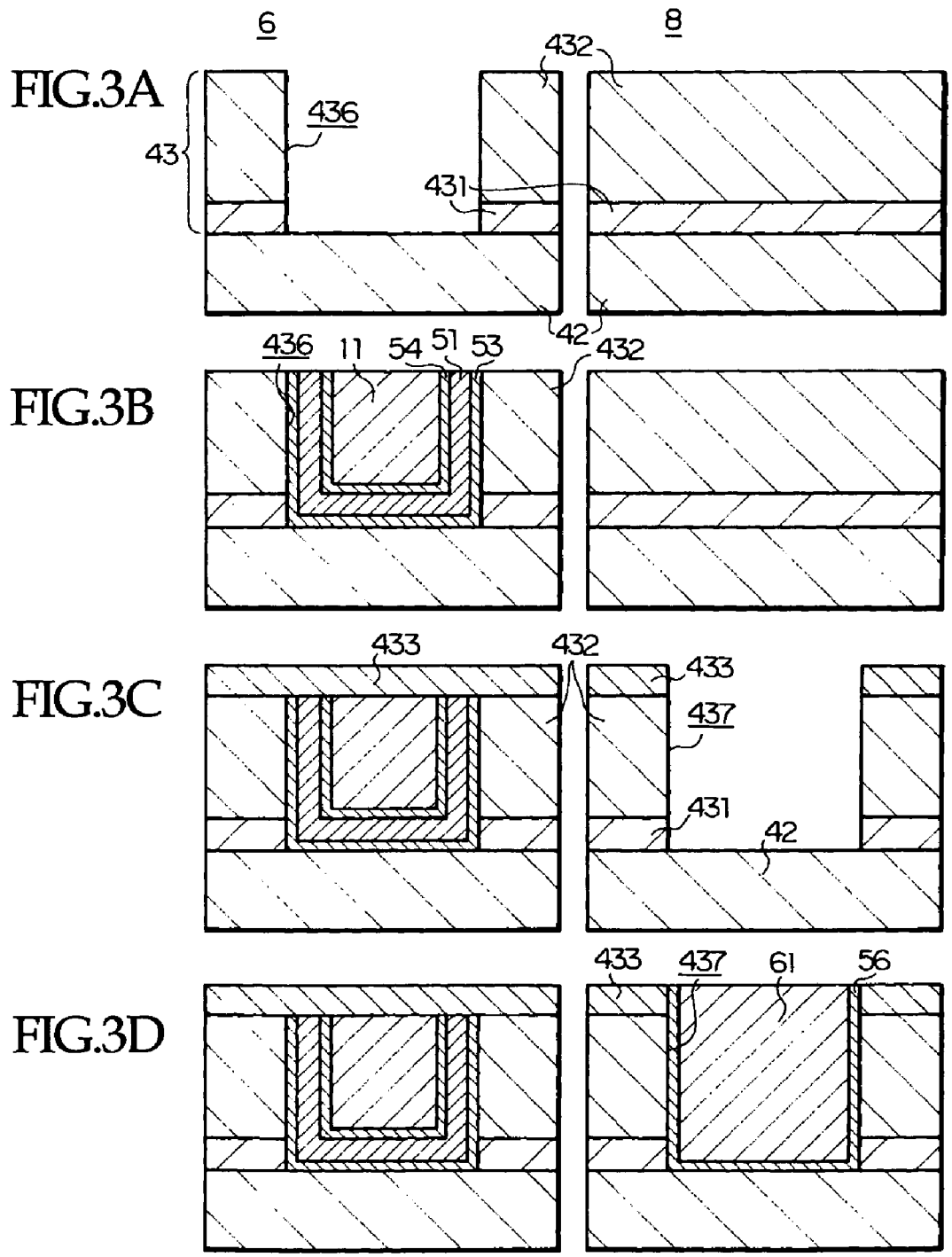

MAGNETIC MEMORY APPARATUS AND METHOD OF MANUFACTURING MAGNETIC MEMORY APPARATUS

CROSS REFERENCES TO RELATED APPLICATIONS

The present invention claims priority to its priority document No. 2003-161451 filed in the Japanese Patent Office on Jun. 6, 2003, the entire contents of which are incorporated by reference herein.

BACKGROUND OF THE INVENTION

1. Field of the Invention

The present invention relates to a magnetic memory apparatus and a method of manufacturing a magnetic memory apparatus, and, more particularly, to a nonvolatile-type magnetic memory apparatus and a method of manufacturing a magnetic memory apparatus which stores information by utilizing a change in a resistance value depending on spin orientation in a ferromagnetic material, which can be parallel or antiparallel.

2. Description of Related Art

With the rapid prevalence of information communication equipment, in particular, of personal compact equipment such as portable telephones, still more improved performance such as a higher circuit integration, faster speed, lower power consumption and the like is demanded for their memory devices, logic devices and the like for constituting the same. In particular, non-volatile memories are considered to be indispensable devices in the age of "ubiquitous".

Even if a server and a network are interrupted by some failure due to, for example, power exhaustion or a trouble, the non-volatile memory can protect important personal information. Then, further improvement of the non-volatile memory so as to have a higher density and a larger capacity is becoming increasingly important as an alternative technology capable of replacing a hard disk and an optical disk which are essentially impossible to reduce the size thereof further because of the presence of movable parts therein.

Further, although the recent portable telephones are designed to be able to reduce power consumption as small as possible by holding the unnecessary circuit blocks thereof in a standby state, if a non-volatile memory that can function as a high speed network memory and as a large capacity storage memory is realized, wastes in power consumption as well as in memories can be eliminated. Still further, a so-called instant-on function capable of instant activation upon the power switch-on can be implemented if such a high speed, large-capacity non-volatile memory is realized.

As the non-volatile memories, there are cited a flash memory which uses semiconductors, a ferroelectric random access memory (FRAM) which uses ferroelectric materials, or the like. However, the flash memory has a drawback that its speed is low because of its write speed being a μ second order. Further, a large scale integration is difficult because of its complicated structure. Moreover, there is a disadvantage that its access time is slow, approximately in the order of 100 ns. On the other hand, as to the FRAM, some problems are indicated in that in order for it to completely replace the static random access memory (DRAM) or the dynamic random access memory (SRAM), its durability is low because of its rewritable frequency being $10^{12}$ to $10^{14}$ times. Further, a problem of difficulty in micro fabrication of the ferroelectric capacitor is also indicated.

A non-volatile memory drawing attention recently as having no such drawbacks described above is a magnetic memory referred to as a MRAM (magnetic random access memory) or a MR (magneto resistance) memory, which are drawing attention nowadays as a result of improvements in the characteristics of materials of recent tunneling magnetoresistance devices (hereinafter referred to as TMR: abbreviation of Tunnel Magnetic Resistance). (For example, see Wang et al., "Feasibility of Ultra-Dense Spin-tunneling Random Access Memory" IEEE Transaction on Magnetics 33 [6] (November 1997) p4498–4512)

The MRAM is easy to integrate because of its simple structure, and it is expected to have a large number of rewritable frequencies because of its storage of information being performed by rotation of magnetic moments. Further, as to its access time, a very high speed is expected, and, already, operability at 10 MHz has been reported (for example, see R. Scheuerlein et al, "TA7.2 A 10 ns Read and Write Non-Volatile Memory Array Using a Magnetic Tunnel Junction and FET Switch in each Cell" 2000 IEEE International Solid-State Circuits Conference Digest of Papers (February 2000) p128–129). At present, now a higher power output is obtainable due to a GMR effect, and it has been improved substantially.

Although the MRAM has such advantages that it is easy to realize a high speed and a large scale integration as described above, a write operation thereof is performed by a magnetic field that is generated when a current is passed through a bit line and a writing word line both provided adjacent to a TMR device. A reversing magnetic field necessary for reversal of a memory layer (storage layer) of the TMR device, although it depends on a material, is 1.58 kA/m to 15.8 kA/m (20 Oe to 200 Oe), and a current required at this time becomes several mA to several tens mA. This leads to increased power consumption, often resulting in a lowered service life, heating, and increased power consumption of the device which often become a demerit to semiconductors.

In order to address this problem regarding the increased power consumption, a structure capable of concentrating a magnetic field generated by the current by shielding the circumferences of a writing word line and a bit line (hereinafter referred to as a clad structure) has been proposed (see Japanese Patent Application Publication 2002-246566 (page 4, FIG. 6)).

FIG. 6 shows a schematic view in perspective of a part of a simplified MRAM using the clad structure formed with a magnetic material layer. As shown in FIG. 6, a circumference of a word line 11 is surrounded by a first magnetic material layer 16, except for the surface thereof facing a magnetoresistance-type memory device (for example, TMR device) 13, so as to concentrate a magnetic flux into the memory device 13. Likewise, a circumference of a bit line 12 is surrounded by a second magnetic material layer 17, except for the surface thereof facing the memory device 13, so as to concentrate a magnetic flux thereof into the memory device 13.

SUMMARY OF THE INVENTION

However, while it is possible to improve a magnetic field efficiency and lower a value of current for writing to the device by use of the clad structure, on the other hand, if this process of cladding the circumferences of wiring with the magnetic material layer is applied to a peripheral circuitry region other than the memory cell, because of an increased complexity of the process, there arises a drawback such that application thereof to a finer wiring becomes difficult and inhibits a higher integration thereof. Further, it is feared that such a drawback may arise that a wiring resistance may increase because of a wiring area reduced by the magnetic material layer in the peripheral circuitry region.

In view of the above background, it is desirable to provide a magnetic memory apparatus and a method of manufacturing the magnetic memory apparatus that can solve or alleviate the drawbacks described above.

A magnetic memory apparatus according to a first aspect of the present invention is a magnetic memory apparatus having a memory cell region and a peripheral circuitry region mounted on the same substrate. In the magnetic memory apparatus of the first aspect, the memory cell region includes first wiring, second wiring that three-dimensionally intersects with the first wiring, and a magnetoresistance-effect type memory device disposed in an intersecting region of the first and the second wiring for storing and reproducing information of a magnetic spin. Further, the peripheral circuitry region includes first wiring that is in the same wiring layer as that of the first wiring in the memory cell region, second wiring that is in the same wiring layer as the second wiring in the memory cell, and a magnetic material layer including a high magnetic permeability layer that is formed on both side surfaces of the first wiring only within the memory cell region and on a surface opposite to a surface facing the memory device.

In the magnetic memory apparatus of the first aspect, because the magnetic material layer including the high magnetic permeability layer is formed on both side surfaces and on the surface opposite to the surface of the first wiring facing the memory device only in the memory cell, utilization efficiency of the magnetic field generated by the first wiring is improved by means of the magnetic material layer, thereby enabling a reduction in value of writing current to the memory device. Moreover, the magnetic material layer for cladding the wiring is formed only in the memory cell region, and it is not formed in the peripheral circuitry region other than that. Thereby, as to the first wiring in the peripheral circuitry region, a higher integration of its wiring becomes possible therein as much as a portion devoid of the formation of the magnetic material layer cladding the wiring. In other words, because a reduced area of wiring due to the formation of the magnetic material layer is eliminated, the wiring resistance is reduced accordingly corresponding to the increased area of wiring. Thereby, power consumption and heat generation can be reduced.

A magnetic memory apparatus according to a second aspect of the present invention is a magnetic memory apparatus including a memory cell region and a peripheral circuitry region mounted on a substrate. The memory cell region includes first wiring, second wiring that three-dimensionally intersects with the first wiring, and a magnetoresistance-effect type memory device disposed in an intersecting region of the first and the second wiring for storing and reproducing information of a magnetic spin. Further, the peripheral circuitry region includes first wiring that is in the same wiring layer as that of the first wiring in the memory cell region, second wiring that is in the same wiring layer as the second wiring in the memory cell, and a magnetic material layer including a high magnetic permeability layer that is formed on both side surfaces of the second wiring only within the memory cell region and on a surface opposite to a surface facing the memory device.

In the aforementioned second magnetic memory apparatus, because a magnetic material layer including a high magnetic permeability layer is formed on both side surfaces of the second wiring only in the memory cell region and on a surface opposite to its surface facing the memory device, utilization efficiency of the magnetic field generated by the second wiring is improved by means of the magnetic material layer, thereby enabling a reduction in value of current for writing to the memory device. Moreover, the magnetic material layer for cladding the wiring is formed only in the memory cell region, and it is not formed in the peripheral circuitry region. Therefore, a large-scale integration of the wiring is enabled as much of that the magnetic material layer for cladding the wiring is eliminated. In other words, because the reduction of wiring area due to the formation of the magnetic material layer can be eliminated, the wiring area can be increased accordingly, thereby enabling a reduction in its wiring resistance. Accordingly, power consumption and heat generation can be reduced.

A method of manufacturing a magnetic memory apparatus according to a first aspect of the present invention is a method of manufacturing a magnetic memory apparatus by forming a memory cell region and a peripheral circuitry region on a substrate. The method includes the steps of: forming first wiring; forming a tunnel magnetoresistance device that has a tunnel insulation layer sandwiched between ferroelectric materials and is electrically insulated from the first wiring; and forming second wiring that is electrically connected to the tunnel magnetoresistance device and three-dimensionally intersects with the first wiring via the tunnel magnetoresistance device interposed therebetween. The forming of the first wiring includes the steps of: forming first wiring in the memory cell region; and forming first wiring in the peripheral circuitry region. Further, the forming of the first wiring in the memory cell region includes the steps of: forming a wiring trench in a region where the memory cell region is to be formed on the substrate; forming a magnetic material layer including a high magnetic permeability layer on an internal surface of the wiring trench; and forming the first wiring inside the wiring trench via the magnetic material layer.

According to the aforementioned first method of manufacturing the magnetic memory apparatus, the step of forming the first wiring includes the step of forming first wiring in the memory cell region and the step of forming first wiring in the peripheral circuitry region. In the step of forming the first wiring in the memory cell region, because the first wiring is formed so as to have a magnetic material layer including a high magnetic permeability layer on both side surfaces of the first wiring and on a surface opposite to its surface facing the memory device, utilization efficiency of a magnetic field generated by the first wiring is increased by means of the magnetic material layer, thereby providing a structure capable of reducing a value of current for writing to the memory device. Moreover, because the step of forming the first wiring in the memory cell region and the step of forming the first wiring in the peripheral circuitry region are performed by different steps, the magnetic material layer for cladding the wiring can be formed only in the memory cell region, avoiding the formation thereof in the peripheral circuitry region. Therefore, as to the first wiring in the peripheral circuitry region, a large-scale integration of the wiring becomes possible therein as much as that corresponding to the elimination of the magnetic material layer cladding the wiring. In other words, because of the elimination of a reduced wiring area due to the formation of the magnetic material layer, a wiring resistance can be reduced correspondingly, thereby resulting in an increased wiring area. Accordingly, a wiring structure capable of reducing power consumption and heat generation is fabricated.

A method of manufacturing a magnetic memory apparatus according to a second aspect of the present invention is a method of manufacturing a magnetic memory apparatus by forming a memory cell region and a peripheral circuitry region on a substrate. The method includes the steps of: forming first wiring; forming a tunnel magnetoresistance device that has a tunnel insulation layer sandwiched between ferroelectric materials and is electrically insulated from the first wiring; and forming second wiring that is electrically connected to the tunnel magnetoresistance device and three-dimensionally intersects with the first wiring via the tunnel magnetoresistance device interposed therebetween. The forming of the second wiring includes the steps of: forming second wiring in the memory cell region; and forming second wiring in the peripheral circuitry region. Further, the forming of the second wiring in the memory cell region includes the steps of: forming a wiring trench in a region where the memory cell region is to formed on the substrate; forming a magnetic material layer including a high magnetic permeability layer on a side surface of the wiring trench; forming second wiring that fills the wiring trench via the magnetic material layer formed on the side surface of the wiring trench; and forming a magnetic material layer including a high magnetic permeability layer on the second wiring.

According to the aforementioned second method of manufacturing the magnetic memory apparatus, the step of forming the second wiring includes the step of forming the second wiring in the memory cell region and the step of forming the second wiring in the peripheral circuitry region. In the step of forming the second wiring in the memory cell region, because the second wiring is formed to have the magnetic material layer including the high magnetic permeability layer on both side surfaces and on the top surface opposite to its surface of the second wiring on the side facing the memory device, utilization efficiency of the magnetic field generated by the second wiring is improved by means of the magnetic material layer, thereby providing a structure capable of reducing a value of current for writing to the memory device. Moreover, because the step of forming the second wiring in the memory cell region and the step of forming the second wiring in the peripheral circuitry region are performed by different steps, the magnetic material layer for cladding the wiring can be formed only in the memory cell region, avoiding forming thereof in the peripheral circuitry region. Therefore, the second wiring in the peripheral circuitry region can be integrated more densely as much as that corresponding to the elimination of the magnetic material layer cladding the wiring therein. In other words, according to elimination of a reduced wiring area due to the formation of the magnetic material layer, a wiring resistance can be reduced as much as that corresponding to the thus-increased wiring area. Thereby, a wiring structure capable of reducing power consumption and the quantity of heat generated is fabricated.

As described heretofore, according to a magnetic memory apparatus in accordance with an embodiment of the present invention, because the magnetic material layer including the high magnetic permeability layer is formed on both side walls of the first wiring and on the rear surface opposite to the surface thereof facing the memory device only in the memory cell region, the efficiency of utilization of the magnetic field generated by the first wiring is improved substantially by use of the magnetic material layer, thereby enabling a reduction in the current value for writing to the memory device. Moreover, because the magnetic material layer cladding the first wiring is formed only in the memory cell region, and is not formed in a peripheral circuitry region other than that, the first wiring in the peripheral circuitry region can be highly integrated as much as that corresponding to the portion devoid of the magnetic material layer surrounding the wiring. Further, because the wiring area can be increased as much corresponding to the portion devoid of the magnetic material layer therein, accordingly the wiring resistance can be decreased. Thereby, power consumption and heat generation can be reduced. Further, as to the second wiring, because the magnetic material layer including the high magnetic permeability layer is formed on both side walls of the second wiring and on the rear surface opposite to the surface thereof opposing the memory device only in the memory cell region, the same function and effect as that of the first wiring can be obtained.

According to a method of manufacturing a magnetic memory apparatus in accordance with an embodiment of the present invention, because of the provision of the so-called clad structure wherein the magnetic material layer including the high magnetic permeability layer is formed on both side walls and on the rear surface opposite to the surface thereof facing the memory device for at least one of the first wiring (write word line) and the second wiring (bit line) in the memory cell region, it becomes possible to manufacture the magnetic memory apparatus capable of improving the efficiency of utilization of the magnetic field. Thereby, because the current value for writing to the memory device can be reduced, the magnetic memory apparatus having low power consumption and low heat generation can be fabricated. Further, the conventional wiring deposition technology can be used in the peripheral circuitry region other than the memory cell region.

BRIEF DESCRIPTION OF DRAWINGS

The above and other objects, features and advantages of the present invention will become more apparent from the following description of the presently-preferred exemplary embodiment of the invention taken in conjunction with the accompanying drawings, in which:

FIG. 2 is a schematic diagram showing a cross section of a magnetic memory apparatus according to a second embodiment of the present invention;

FIG. 3 is a schematic diagram showing a process of manufacturing a magnetic memory apparatus in cross sections according to a first embodiment of the present invention;

DETAILED DESCRIPTION OF EMBODIMENTS

With reference to the schematic structural cross-sectional view of FIG. 1, a magnetic memory apparatus according to a first embodiment of the present invention will be described. According to the first embodiment of the present invention, a magnetic material layer is formed such that a current magnetic field generated by a word writing line in a memory cell region is efficiently concentrated into a memory layer therein, and in a peripheral circuitry region wiring that does not creates any magnetic material layer is disposed.

Figure 1:
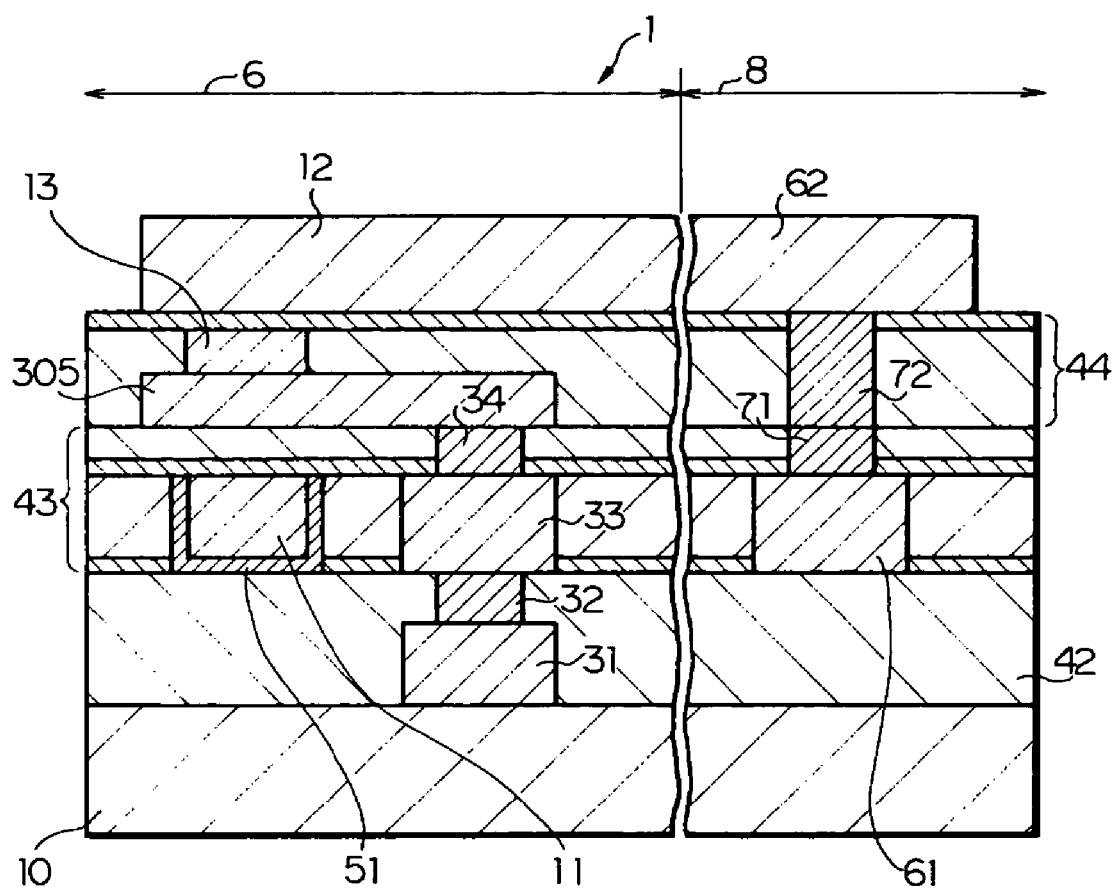
FIG. 1 is a schematic diagram showing a cross section of a magnetic memory apparatus according to a first embodiment of the present invention.
Figure 4A:
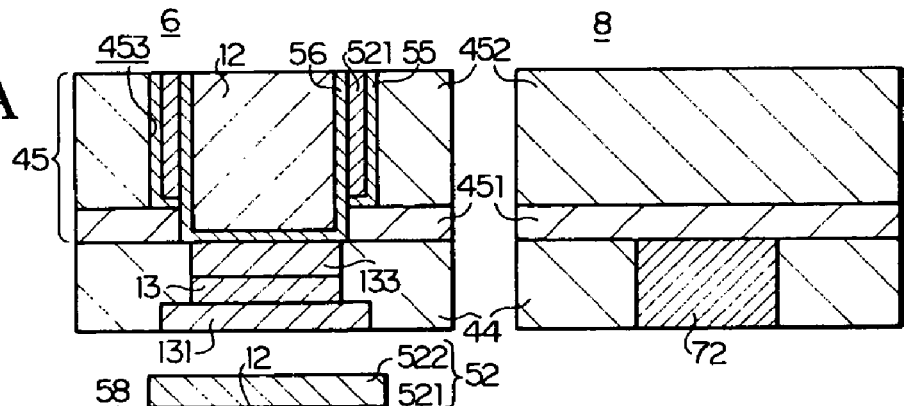
FIG. 4 is a schematic diagram showing a process of manufacturing a magnetic memory apparatus in cross sections according to a second embodiment of the present invention.
Figure 4B:
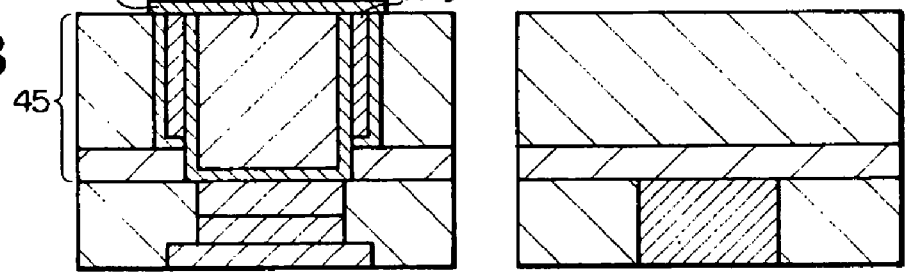
Figure 4C:
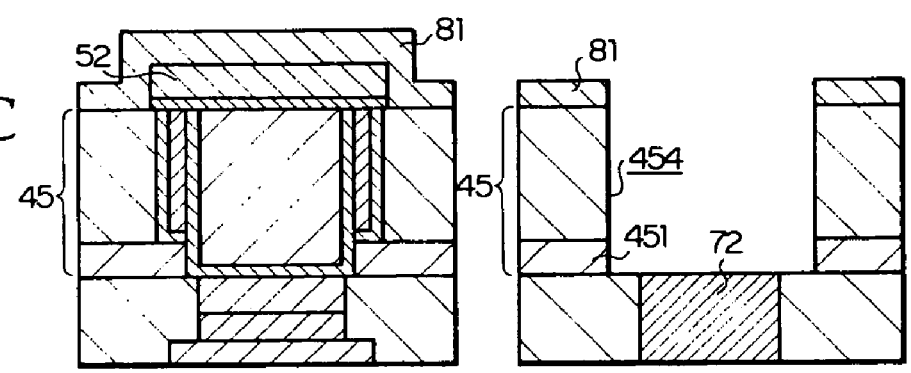
Figure 4D:
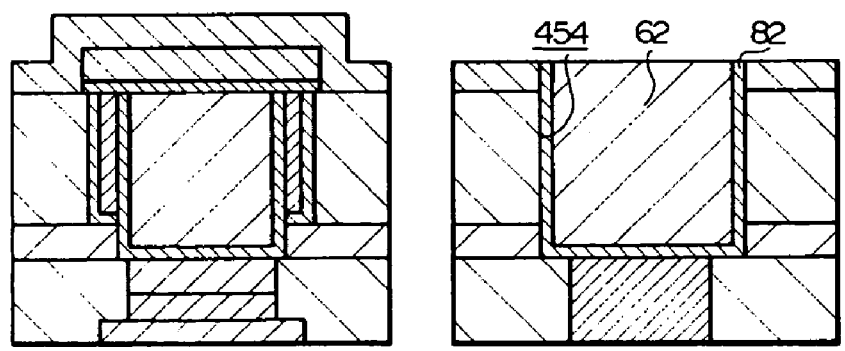

As illustrated in FIG. 1, there is provided a semiconductor device substrate 10 having devices, wiring, insulation films and the like formed thereon. On this semiconductor substrate 10, for example, on a surface side of the semiconductor substrate (for example, p-type semiconductor substrate), a p-type well region is formed, and in this p-type well region, a device isolation region for isolating a region where a transistor is to be formed is formed by a so-called STI (Shallow Trench Isolation). Above the aforementioned p-type well region, a gate electrode (word line) is formed via a gate insulation film. In the p-type well region on both sides of the gate electrode, a diffusion layer region (for example, N-diffusion layer region) is formed for configuring a field-effect-type transistor for selection. This field effect transistor functions as a switching device for read-out. Other than n-type or p-type field effect transistors, various switching devices, such as a diode, bipolar transistor or the like, can be also used.

A first insulation film is formed in such a state as to surround the aforementioned field-effect-type transistor, and a contact (for example, a tungsten plug) to be connected to the aforementioned diffusion layer region is formed in this first insulation film 41. Further, above the first insulation film, a sense line (not shown), a connection electrode 31 and the like are formed.

On the aforementioned first insulation film, a second insulation film 42 is formed. The second insulation film 42 in a memory cell region 6 surrounds the sense line (not shown), a connection electrode 31 and the like. Also, in the second insulation film 42, a contact (for example, a tungsten plug) 32 connected with the aforementioned connection electrode 31 is formed. Further, above the second insulation film 42, there are formed a connection electrode 33 connected with the contact 32, first wiring (writing word line) 11 and the like. The first wiring may be described as the write word line in the following. The aforementioned write word line 11 is provided with a magnetic material layer 51 including a high magnetic permeability layer that is formed so as to clad both side walls of the write word line 11 and a bottom surface opposite to a top surface thereof opposing a tunnel magnetoresistance device (hereinafter referred to as TMR) 13. On the other hand, on the second insulation film 42 in a peripheral circuitry region 8, first wiring 61 associated with the peripheral circuitry region 8 is formed. No magnetic material layer is formed on the side walls of this first wiring 61 and on the bottom surface thereof.

Further, as the high magnetic permeability material for forming the magnetic material layer 51, for example, a soft magnetic material having a maximum permeability $\mu_m$ in excess of 100 can be used, and more specifically, for example, an alloy containing nickel, iron and cobalt, an iron-aluminum (FeAl) alloy, or a ferrite alloy can be used. Further, in the case where no electrical insulation layer is provided between the write word line 11 and the magnetic material layer 51, it is preferable to use a soft magnetic film having a high specific resistivity as the magnetic material layer 51 in order to prevent a current loss.

Above the aforementioned second insulation film 2 in the memory cell region 6, there is formed a third insulation film 43 which surrounds the aforementioned write word line (first wiring) 11, the magnetic material layer 51, the connection electrode 33, the first wiring 61 in the peripheral circuitry region 8 and the like. This third insulation film 43 has a lamination structure, for example, obtained by sequentially laminating from the bottom, an insulation film functioning as an etching stopper, an interlayer insulation film, an insulation film functioning as an etching stopper, and an interlayer insulation film. In the case where the write word line (first wiring) 11 and the first wiring 61 are to be formed, for example, as an embedded copper wiring, it is preferable for the insulation film functioning as an upper etching stopper to have a function to prevent diffusion of copper and penetration of oxygen into the copper wiring, which is thereby preferably formed, for example, using a nitride film. In this third insulation film 43, there are formed a plug 34 connected with the aforementioned connection electrode 33 and a plug 71 connected with the first wiring 61 in the peripheral circuitry region 8.

Further, on the aforementioned third insulation film 43 in the memory cell region 6, there is formed an antiferromagnetic material layer 305 that is connected from the upper direction of the aforementioned write word line 11 to the aforementioned plug 34. On this antiferromagnetic material layer 305 and above the aforementioned write word line 11, there is formed a memory device (hereinafter referred to as TMR device) 13. This memory device 13, as one example, is comprised of a magnetization pinned (fixed) layer made from a ferromagnetic material layer, a tunnel insulation layer formed on the magnetization pinned layer, a memory (storage) layer formed on the tunnel insulation film the orientation of magnetization in which is relatively easily rotated, and a cap layer thath is formed on the memory layer. By way of example, a bypass line (drawn integral with the antiferromagnetic layer 305 in the drawing) is provided in an extended state of the magnetization pinned layer on the antiferromagnetic material layer 305.

On the aforementioned third insulation film 43 in the memory cell region 6, there is formed a fourth insulation film 44 that surrounds the aforementioned memory device 13 et al. The surface of this fourth insulation film 44 is planarized, and the surface of the cap layer of the uppermost layer of the memory device 13 is exposed. Above the aforementioned fourth insulation film 44, there is formed second wiring (bit line) 12 which is in contact with the top surface of the memory device 13 and three-dimensionally intersects (e.g., perpendicularly crossing) with the aforementioned write word line 11 via the memory device 13 interposed therebetween.

On the other hand, above the fourth insulation film 44 in the peripheral circuitry region 8, there is formed second wiring 62 of the peripheral circuitry region 8. Further, in the fourth insulation film 44, there are formed a plug 71 which is connected to the aforementioned first wiring 61 and a plug 72 which is connected to the second wiring 62. Also, these plugs 71 and 72 may be formed integral.

The aforementioned memory device 13 is not limited to the above-mentioned structure, and it may have any structure provided that it has a tunnel magnetoresistance (TMR) effect. As an example, the magnetization pinned layer to be formed on the antiferromagnetic material layer 305 can be formed also by sequentially laminating a first pinned magnetization layer, a conductive layer providing anti-ferromagnetic coupling with the magnetic layer, and a second pinned magnetization layer. This pinned magnetization layer may have a lamination structure, a monolayer structure of a ferromagnetic material layer, or a lamination structure having more than three ferromagnetic layers laminated via a conductive layer interposed therebetween. Further, it is also possible to form a lining conductive layer for use in connecting with a switching device in series connection with the TMR device, as an underlayer of the aforementioned antiferromagnetic material layer 305. Still further, the antiferromagnetic material layer 305 may serve also as the lining conductive layer.

The aforementioned memory layer, the first magnetization pinned layer, is made from a ferromagnetic material such as, for example, nickel, iron or cobalt, or an alloy including at least two of nickel, iron and cobalt.

The aforementioned first magnetization pinned layer is formed in a state in contact with the antiferromagnetic material layer. Due to an exchange interaction between these layers, the first magnetization pinned layer has a strong unidirectional magnetic anisotropy.

As the aforementioned antiferromagnetic material layer, there can be used any one selected from the group consisting of, for example, an iron-manganese alloy, a nickel-manganese alloy, a platinum-manganese alloy, an iridium-manganese alloy, a rhodium-manganese alloy, a cobalt oxide, and a nickel oxide.

The aforementioned tunnel insulation layer is comprised of, for example, an aluminum oxide, a magnesium oxide, a silicon oxide, an aluminum nitride, a magnesium nitride, a silicon nitride, an aluminum nitride oxide, a magnesium nitride oxide, or a silicon nitride oxide.

The aforementioned tunnel insulation layer has functions to cut off magnetic coupling between the memory layer and the magnetization pinned layer as well as to pass through a tunneling current. These magnetic films and conductive layers are deposited mainly by sputtering. The tunnel insulation layer can be obtained by oxidizing, nitriding or oxidizing and nitriding a metal film deposited by sputtering.

The aforementioned cap layer has functions to prevent a cross diffusion with wiring for connecting between a memory device 13 and another memory device 13, to reduce contact resistance and to prevent oxidization of the memory layer. Usually, this is formed using copper, tantalum nitride, tantalum, titanium nitride or the like.

The operation of the aforementioned magnetic memory apparatus 1 will be described in the following. In the aforementioned memory device 13, information is read out by detecting a change in a tunnel current due to the magnetoresistance effect; however, the magnetoresistance effect thereof depends on relative orientations of magnetization in the memory layer and the magnetization pinned layer.

Further, in the memory layer 13, an orientation of magnetization in the memory layer is changed by a synthetic magnetic field generated by passing a current through the bit line 12 and the writing word line 11 so as to store "1" or "0" therein. Read out thereof is performed by detecting a change in a tunnel current due to the magnetoresistance effect. If orientations of magnetization in the memory layer and the magnetization pinned layer are identical, a low electrical resistance (for example, "0") is assumed. If orientations of magnetization in the memory layer and the magnetization pinned layer are antiparallel, a high electrical resistance (for example, "1") is assumed.

In the aforementioned magnetic memory apparatus 1, because the magnetic material layer 51 made from the high magnetic permeability layer is formed on both side surfaces of the first wiring (writing word line) 11 and on the bottom surface opposite to its surface opposing the memory device 13 selectively only in the memory cell region, the utilization efficiency of the magnetic field generated by the first wiring 11 is increased substantially by means of the magnetic material layer 51, thereby allowing the value of a current for writing to the memory device 13 to be reduced. Moreover, the magnetic material layer 51 for cladding the first wiring is formed only in the memory cell region, and it is not formed in the peripheral circuitry region 8 outside thereof. Therefore, the first wiring 61 in the peripheral circuitry region 8 can be integrated more densely as much as that corresponding to a portion devoid of the magnetic material layer for cladding the first wiring therein. In other words, because a reduced area of wiring due to the formation of the magnetic material layer is eliminated, a cross-section area of the wiring for the first wiring 61 therein is increased that much accordingly by being allowed to increase the wiring area therefor. Thereby, as the wiring resistance is reduced, power consumption and heat generation can be reduced.

By referring to FIG. 2, which illustrates a schematic structural cross section, a magnetic memory apparatus according to a second embodiment of the present invention will be described. FIG. 2(2) illustrates a cross section of a bit line in a width direction, which is to be formed in a memory cell region 6 in FIG. 2(1).

According to the second embodiment of the present invention, in order that a current magnetic field generated by a bit line (second wiring) in a memory cell region 6 is efficiently concentrated into a memory layer, a magnetic material layer is formed, and then in a peripheral circuitry region 8, second wiring without forming the magnetic material layer is disposed.

As shown in FIG. 2, there is provided a semiconductor device substrate 10 formed with devices, wiring, insulation films and the like. On this semiconductor device substrate 10, for example, a p-type well region is formed on the surface side of the semiconductor substrate (e.g. p-type semiconductor substrate), and in this p-type well region, a device isolation region for isolating a transistor-forming region is formed by a so-called STI (Shallow Trench Isolation) Above the aforementioned p-type well region, a gate electrode (word line) is formed via a gate insulation film, and in the p-type well region on both sides of the gate electrode, a diffusion layer region (for example, $N^+$ diffusion layer region) is formed to configure a field-effect-type transistor for use of selection. This field effect transistor functions as a switching device for reading out. This can be implemented also by using various switching devices, such as a diode, a bipolar transistor or the like, other than the n-type or p-type field effect transistors.

A first insulation film is formed in a state surrounding the aforementioned field-effect-type transistor, and in this first insulation layer 41 there is formed a contact (for example, a tungsten plug) connected to the aforementioned diffusion layer region. Further, above the first insulation film, there are formed a sense line (not shown) connected to the contact, a connection electrode 31 and the like.

On the aforementioned first insulation film there is formed a second insulation film 42. The second insulation film 42 in the memory cell region 6 covers the aforementioned sense line, a connection electrode 31 and the like. Further, in the second insulation film 42 there is formed a contact (for example, a tungsten plug) 32 connected with the aforementioned connection electrode 31. Furthermore, on the second insulation film 42 there are formed a connection electrode 33 connected with the contact 32, a write word line 11 as the first wiring and the like. It is more preferable to provide a magnetic material layer 51 made from a high magnetic permeability layer so as to surround both side walls of the writing word line 11 and the bottom surface opposite to the upper surface thereof opposing a tunnel magnetoresistance device (hereinafter referred to as TMR) as described in the first embodiment; nevertheless, it is still possible to write information to memory device 13 by the write word line 11 without the provision of the magnetic material layer 51. On the other hand, on a second insulation film 42 in the peripheral circuitry region 8, there is formed second wiring 61 of the peripheral circuitry region 8. No magnetic material layer is formed on the side walls of this first wiring 61 or on the bottom surface thereof.

On the second insulation film 42 in the memory cell region, a third insulation film 43 is formed, which encapsulates the write word line (the first wiring) 11, the magnetic material layer 51, the connection electrode 33, as well as the first wiring 61 in the peripheral circuitry region 8, and the like. This third insulation film 43 has a structure of sequentially laminating from the bottom, for example, an insulation film functioning as an etching stopper layer, an interlayer insulation film, an insulation film functioning as an etching stopper layer, and an interlayer insulation film. In the case where the write word line (the first wiring) 11 and the first wiring 61 are formed, for example, using an embedded copper wire, it is preferable for the insulation film serving as the upper etching stopper layer to have functions to prevent copper diffusion and to serve as a film for preventing infiltration of oxygen into the copper wire, and thereby it is formed using, for example, a nitride film. In this third insulation film 43, there are formed a plug 34 connected to the connection electrode 33 and a plug 71 connected to the first wiring 61 in the peripheral circuitry region 8.

Further, on the third insulation film 43 in the memory cell region 6, an antiferromagnetic material layer 305 which contacts with the plug 34 from the upper direction of the write word line 11 is formed, and a memory device (hereinafter referred to as a TMR device) is formed on this antiferromagnetic material layer 305 and above the writing word line 11. This memory device 13 is comprised of, for example, a magnetization pinned layer made from a ferromagnetic layer, a tunnel insulation layer formed on the magnetization pinned layer, a memory layer that is formed on the tunnel insulation layer and has a relatively easy rotation of magnetization, and a cap layer that is formed on the memory layer. By way of example, a bypass line is formed on the antiferromagnetic layer 305 in an extended state of the magnetization pinned layer (drawn integral with the antiferromagnetic layer 305 in the drawing).

On the aforementioned third insulation film 43 in the memory cell region 6, there is formed a fourth insulation film 44 which encapsulates the aforementioned memory device 13 and the like. This fourth insulation film 44 has a planarized surface, and the surface of the uppermost cap layer of the memory device 13 is exposed therefrom. Above the fourth insulation film 44, there is formed second wiring (bit line) 12 which makes contact with the upper surface of the memory device 13 and three-dimensionally intersects (e.g., crossing perpendicularly) with the write word line 11 via the memory device 13 interposed therebetween. For the bit line 12, there is formed a magnetic material layer 52 made from a high magnetic permeability layer so as to surround both side surfaces of the bit line 12 and an upper surface opposite to a bottom surface thereof opposing a tunnel magnetoresistance device (hereinafter referred to as TMR).

On the other hand, on the fourth insulation film 44 in the peripheral circuitry region 8, there is formed second wiring 62 of the peripheral circuitry region 8. No magnetic material layer is formed on both side walls of this second wiring 62 and on the bottom surface thereof. Further, in the fourth insulation film 44, there are formed a plug 71 in contact with the first wiring 61 and a plug 72 in contact with the second wiring 62. These plugs 71, 72 may be formed integral.

Further, as a high magnetic permeability material for forming the aforementioned magnetic material layers 51, 52, a soft magnetic material having a maximum permeability $\mu_m$, for example, in excess of 100 may be used, and more specifically, for example, an alloy which contains nickel, iron and cobalt, an FeAl alloy, or a ferrite alloy may be used. By way of example, in the case if no electrical insulation layer is provided between the write word line 11 and the magnetic material layer 51, and also no electrical insulation layer is provided between the bit line 12 and the magnetic material layer 61, it is preferable for the magnetic material layer 51 to use a soft magnetic film having a high specific resistivity in order to prevent a current loss.

The aforementioned memory device 13 may be made from any material provided that it has the tunnel magnetoresistance (TMR: Tunnel Magnetic Resistance) effect, and therefore the same materials as set forth in the description of the first embodiment may be used. It is also possible to form a lining conductive layer (not shown) as an underlayer of the antiferromagnetic material layer 305 for use in connecting to a switching device connected in series with the TMR device. Further, it is possible to make the antiferromagnetic material layer 305 function also as the lining conductive layer.

As the antiferromagnetic material layer, the first magnetization pinned layer, the conductive layer, the second magnetization pinned layer, the tunnel insulation layer, the memory layer, the cap layer and the like described above, the same materials as described in the aforementioned first embodiment can be used.

Further, operation of the aforementioned magnetic memory apparatus 2 is basically the same as that of the aforementioned magnetic memory apparatus 1 according to the first embodiment.

In the aforementioned magnetic memory apparatus 2, although the magnetic materials layers 51, 52 are provided to the writing word line 11 and the bit line 12 in the memory cell region 6, it is still possible to improve the write-in efficiency to write to the memory device 13 by provision of the magnetic material layer 51 only to the write word line 11 as in the first embodiment, or by provision of the magnetic material layer 52 only to the bit line 12, in comparison with a structure where no magnetic material layer is provided.

In the aforementioned magnetic memory apparatus 2, because the magnetic material layer 52 is formed on both side surfaces of the second wiring (write word line) 12 and on the upper surface opposite to the bottom surface thereof opposing the memory device 13 only in the memory cell region 6, the utilization efficiency of the magnetic field generated by the second wiring 12 is increased by means of the magnetic material layer 52, and a value of current for writing to the memory device 13 is reduced. In addition, the magnetic material layer 52 for cladding the second wiring 12 is formed only in the memory cell region 6, and it is not formed in the peripheral circuitry region 8 outside thereof. Therefore, a higher integration of the second wiring 62 in the peripheral circuitry region 8 is enabled as much as that corresponding to a portion devoid of the magnetic material layer cladding the second wiring 62. In other words, because of elimination of a reduction in the wiring area due to the formation of the magnetic material layer, a cross sectional area of the wiring is increased in accordance with an increased wiring area of the second wiring 62, thereby reducing a wiring resistance. Thereby, power consumption and heat generation can be reduced.

Further, in the aforementioned magnetic memory apparatus 2, even if a magnetic material layer 52 is formed on the side walls of the second wiring 62 in the peripheral circuitry region 8 for the reason of simplifying its manufacturing process, a wiring resistance of the second wiring 62 is still reduced in comparison with a case where the second wiring 62 is formed by the same process as with the bit line 12 in the memory region 6.

In the first and the second wirings 11, 12 in the aforementioned magnetic memory apparatuses 1, 2, it is preferable to form a barrier metal layer (not shown) so as to surround the circumference of the wiring. That is, the magnetic material layer 51 to be formed around the first wiring 11 and the magnetic material layer 52 to be formed around the second wiring 12 are formed in the circumference of the wiring, preferably, via the barrier metal layer (not shown). Further, also on the outside of the magnetic material layers 51, 52, it is preferable to form a barrier metal layer for isolating the magnetic material layers 51, 52 from the circumferential insulation films in the circumference thereof. Further, the film structures of the first to the fifth insulation films are some examples, and any other appropriate configurations may be used. For example, as to the stopper insulation film, if a sufficient etching selectivity can be secured between the upper insulation film of the stopper insulation film and the lower insulation film of the stopper insulation film when the upper insulation film is etched, the stopper insulation film may be omitted. Further, the wiring may have a structure that is obtained by forming an insulation film that surrounds the wiring after the wiring has been formed by a conventional wiring fabrication process, then by planarizing the surface of the insulation film, or a structure of a trench wiring that is obtained by forming a wiring trench in an insulation film after forming the insulation film, and embedding a wiring material therein.

Now, with reference to FIG. 3, which shows a manufacturing process in cross sections, a method of manufacturing a magnetic memory apparatus according to a first embodiment of the present invention will be described. In this first embodiment, a method of manufacturing the first wiring (write word line) featuring the present invention will be described in detail. By way of example, diagrams on the left-hand side in FIG. 3 depict a memory cell region 6, and diagrams on the right-hand side depict a peripheral circuitry region 8.

By known technology, for example, on a semiconductor substrate, a device isolation region is formed for isolating between respective device-forming regions in the memory cell region, or between respective device-forming regions in the peripheral circuitry region 8, and then switching devices are formed for read-out in respective device-forming regions in the memory cell region 6. This switching device can be formed using various types of switching devices such as n-type or p-type field effect transistors, diodes, bipolar transistors or the like. Further, also in the peripheral circuitry region 8, desired devices, wiring and the like are formed.

A first insulation film is formed in such a state as to cover the aforementioned field effect type transistors, the peripheral circuitry region 8 and the like; then, for example, in the first insulation film 41, a contact (for example, a tungsten plug) is formed to be connected to a lower device, wiring and the like below the aforementioned switching devices or the like. Further, on the first insulation film, there are formed a sense line connected to the contact, a connection electrode and the like.

On the aforementioned first insulation film, there is formed a second insulation film 42. The second insulation film 42 in the memory cell region 6 covers the aforementioned sense line, the connection electrode and the like. Further, in the second insulation film 42, there is formed a contact (for example, a tungsten plug) to be connected to the connection electrode.

Subsequently, as shown in FIG. 3(1), on the second insulation film 42, there is formed a third insulation film 43. Firstly, after forming a stopper insulation film 431 to function as an etching stopper layer on the second insulation film 42, an interlayer insulation film 432 in which the first wiring is to be formed is formed thereon. The aforementioned stopper insulation film 431 can be made using, for example, silicon nitride or silicon carbide. The aforementioned interlayer insulation film 432 can be made using an insulating material film, such as, for example, a silicon oxide (SiO2) film, a silicon oxide fluorinate (SiOF) film, a silicon oxide carbide (SiOC) film, an organic compound film or the like, or a lamination film provided by laminating a plurality thereof. After that, a first wiring trench 436 for forming first wiring (write word line) therein is formed in the memory cell region 6. This first wiring trench 436 is fabricated by a lithography technology using a photo-resist and an etching technology using a resist mask thus formed. During this process, in order to prevent the second insulation film 42 in the lower level from being over-etched during etching of the insulation film 432 in which the first wiring is to be formed, the etching of the insulation film 432 into which the first wiring is to be formed is once stopped above the stopper insulation film 431, and then, followed by a selective etching of the stopper insulation film 431 relative to the second insulation film 42, the first wiring trench 436 is completed.

Next, as shown in FIG. 3(2), after forming films of a barrier metal layer 53 and a magnetic material layer 51 (this magnetic material layer 51 may be formed by laminating plural types of magnetic material layers) on the internal surface of the first wiring trench 436, for example, by sputtering, a barrier metal layer 54 is formed. The barrier metal layers 53, 54 may be formed using any appropriate material provided that it inhibits a reaction or diffusion between the wiring layer and the magnetic material layer. For example, tantalum (Ta), tantalum nitride (TaN), tungsten (W), tungsten nitride (WN), titanium (Ti), titanium nitride (TiN) or the like can be used therefor. Further, as the magnetic material layer 51, a soft magnetic material having a maximum permeability $\mu_m$, for example, over 100 can be used. More specifically, as an example, nickel, iron, cobalt, or an alloy containing one or more of them, an iron-aluminum (FeAl) alloy, or a ferrite alloy may be used. By way of example, in the case if no electrical insulation layer is provided between the write word line 11 and the magnetic material layer 51, it is desirable to use a soft magnetic film having a high specific resistivity as the magnetic material layer 51 in order to prevent a current loss. Further, in the case if the first wiring 11 is to be formed using copper, a copper seed layer (not shown) is formed by sputtering. Then, for example, by electrolytic plating, inside the first wiring trench 436 is embedded with a copper film. After that, by chemical mechanical polishing, excess copper film, barrier metal layers 53, 54, magnetic material layer 51 and the like present on the interlayer insulation film 432 are removed. Then the first wiring (write word line) 11 made from the copper film is formed in the first wiring trench 436 via the barrier metal layer 53, the magnetic material layer 51 and the barrier metal layer 54. The aforementioned first wiring 11 can be formed also using, for example, a copper alloy, aluminum, an aluminum alloy or the like.

Subsequently, as shown in FIG. 3(3), on the aforementioned interlayer insulation film 432, a stopper insulation film 433, which covers the first wiring 11 and serves as an etching stopper layer as well as a protective layer of the copper wiring, is formed. The aforementioned stopper insulation film 433 can be formed using, for example, silicon nitride or silicon carbide. After that, a first wiring trench 437 for forming first wiring in the peripheral circuitry region 8 is formed. This first wiring trench 437 is formed by lithography technology using a photo-resist and by etching technology using a resist mask formed thereby. At this time, in order to inhibit over-etching of the second insulation film 42 in the lower level when etching the interlayer insulation film 432 to form the first wiring therein, etching of the layer insulation film 432 to form the first wiring therein is stopped once above the stopper insulation film 431 serving as the etching stopper layer, and then by selectively etching the stopper insulation film 431 relative to the second insulation film 42, the first wiring trench 437 in the peripheral circuitry region 8 is completed.

Further, as shown in FIG. 3(4), for example, by sputtering on the internal surface of the first wiring trench 437, a barrier metal layer 56 is deposited. As for the barrier metal layer 56, any metal, for example, tantalum (Ta), tantalum nitride (TaN), tungsten (W), tungsten nitride (WN), titanium (Ti), titanium nitride (TiN) or the like may be used, provided that it inhibits a chemical reaction and diffusion of the wiring layer. Further, in the case where the first wiring 11 is to be formed with copper, a copper seed layer (not shown) is formed by sputtering. Then, for example, by electrolytic plating, the inside of the first wiring trench 437 is embedded with a copper film. After that, by chemical mechanical polishing, excessive copper film, the barrier metal layer 56 and the like remaining on the layer insulation film 432 are removed, thereby forming the first wiring 61 made from the copper film into the first wiring trench 437 via the barrier metal layer 56. The aforementioned first wiring 61 may also be formed using, instead of copper, for example, a copper alloy, aluminum, aluminum alloys or the like. By the way, it is preferable to form a cap-barrier metal layer (not shown) on the first wiring 11 in this peripheral circuitry region 8 in order to inhibit diffusion of copper as well as to prevent oxidization of copper. As the cap-barrier metal layer, for example, a silicon nitride film, a cobalt tungsten phosphor (Co—W—P) film or the like can be used.

Next, after having formed the first wiring 11 and 61 in the memory cell region 6 and the peripheral circuitry region 8, an interlayer insulation film (not shown) that covers the first wiring 11, 61 is formed on the aforementioned stopper insulation film 433.

By way of example, by a simultaneous process forming the first wiring 11 in the peripheral circuit region 8, it is also possible to form a plug, a connection electrode and the like in the memory cell region 6.

Subsequently, although not shown in the drawing, by a known process of manufacturing the magnetic memory apparatus, a memory device having a TMR effect is formed above the write word line 11 via an insulation film, and then a bit line and the like that is to be connected to this memory device and three-dimensionally intersects (perpendicularly crosses) with the word line 11 via the memory device interposed therebetween is formed.

According to the aforementioned first method of manufacturing the magnetic memory apparatus, the step of forming the first wiring is comprised of a step of forming the first wiring (write word line) 11 in the memory cell region 6 and a step of forming the first wiring 61 in the peripheral circuitry region 8, wherein in the step of forming the first wiring 11 in the memory cell region 6, because the first wiring (write word line) 11 is formed to have a magnetic material layer 51 made from a high magnetic permeability layer provided on both side walls of the first wiring (write word line) and on the bottom surface opposite to the upper surface thereof opposing the memory device 13, an utilization efficiency of the magnetic field generated by the first wiring (word line) 11 is increased by use of the magnetic material layer, thereby providing a structure in which a value of current for writing to the memory device 13 is reduced. Moreover, because the process of forming the first wiring (word line) 11 in the memory cell region 6 and the process of forming the first wiring 61 in the peripheral circuit region 8 are carried out in a different step, the magnetic material layer 51 for cladding the first wiring 11 can be formed only in the memory cell region 6, and it is not formed in the peripheral circuitry region 8 outside thereof. Therefore, the first wiring 61 in the peripheral circuitry region 8 can be integrated higher as much as that corresponding to a portion devoid of the magnetic material layer for cladding the wiring therein. In other words, because of the elimination of a reduced wiring area due to the formation of the magnetic material layer, accordingly, a wiring resistance can be reduced as much as that of an increased wiring area. Thereby, a wiring structure capable of reducing power consumption and heat generation can be formed.

The above-mentioned method of manufacture is an example for manufacturing the magnetic memory apparatus 1 described in reference to FIG. 1. In the case of forming the magnetic memory apparatus 1, the method may use such a process whereby the magnetic material layer remains on the side walls or on the bottom surface of the first wiring 11 in the peripheral circuitry region 8 as well.

In the following, a method of manufacturing the magnetic memory apparatus according to a second embodiment of the present invention will be described by referring to FIG. 4, which illustrates manufacturing processes thereof in cross sections. In this second embodiment, a method of manufacturing second wiring (bit wiring) featuring the present invention will be described in detail. By way of example, on the left-hand side of the drawing, a memory cell region 6 is shown, and on the right-hand side thereof, a peripheral circuitry region 8 is shown.

By known technology, for example, on a semiconductor substrate, a device isolation region for isolating between respective device-forming regions in the memory cell region 6 and between respective device-forming regions in the peripheral circuitry region 8 is formed, and then a switching device for read-out is formed in the device-forming region in the memory cell region 6. This switching device can be formed using various types of switching devices such as n-type or p-type field effect transistors, diodes, bipolar transistors or the like. Further, also in the peripheral circuitry region 8, a desired device, wiring and the like are formed.

In such a state surrounding the aforementioned field-effect-type transistor, the peripheral circuitry region 8 and the like, a first insulation film is formed, and in the first insulation film, for example, a contact (e.g., a tungsten plug) to be connected to a device or wiring in an underlayer below the aforementioned switching device is formed. Further, on the first insulation film, a sense line, a connection electrode and the like to be connected to the contact are formed.

On the aforementioned first insulation film, there is formed a second insulation film. The second insulation film in the memory region 6 surrounds the aforementioned sense line, the connection electrode and the like. Further, in the second insulation film, there is formed a contact (for example, a tungsten plug) to be connected to the aforementioned connection electrode.

Subsequently, a third insulation film is formed on the aforementioned second insulation film. Then, by the method described by referring to FIG. 3, or by a conventional method of forming the write word line, first wiring (write word line) is formed in the third insulation film. According to the method described with reference to FIG. 3, after having formed the first wiring (write word line) in the memory cell region 6, the first wiring in the peripheral circuitry region 8 is formed. On the other hand, according to the conventional method of forming the write word line, both the first wiring (write word line) in the memory cell region 6 and that in the peripheral circuitry region 8 are formed simultaneously. Preferably, the former method is used. Thereafter, a third insulation film is formed to cover the first wiring. By way of example, it is also possible to form the plug, connection electrode and the like in the memory cell region 6 by a process simultaneous to that of forming the first wiring in the peripheral circuitry region 8.

As shown in FIG. 4(1), subsequently, on the aforementioned third insulation film (not shown), there are formed a conductive layer 131, a memory device of the magnetoresistance type (for example, TMR device) 13, and a conductive cap layer (protective metal layer) 133. Further, in such a manner as to encapsulate the memory device 13, the cap layer 133 and the like, a fourth insulation film 44 is formed. After that, by chemical and mechanical polishing, an upper surface of the cap layer 133 is exposed, and also the surface of the fourth insulation film 44 is planarized. The processes described hitherto can be carried out by a conventional method and are not limited to the aforementioned processes. Further, by use of a conventional method of forming a plug for connecting between an upper layer wiring and a lower layer wiring, a plug to be connected to a lower layer wiring or electrode can be formed also in the aforementioned fourth insulation film 44. Here, as shown in the drawing, as an example, a plug 72 is formed in the peripheral circuitry region 8. When forming the plug 72, a conventional plug forming technique can be used.

Further on the fourth insulation film 44, a stopper insulation film 451 serving as an etching stopper layer and an interlayer insulation film 452 serving as a fifth insulation film 45 are sequentially formed. The stopper insulation film 451 and the interlayer insulation film 453 constitute the fifth insulation film 45. The aforementioned stopper insulation film 451 is formed with an insulation film whereby etching is stopped when etching the interlayer insulation film 452, and is formed, for example, using a silicon nitride (SiN) film, a silicon carbide (SiC) film or the like. The aforementioned interlayer insulation film 452 is formed from an insulating material film such as a silicon oxide (SiO2) film, a silicon oxide film containing fluorine (SiOF), a silicon oxide carbonate (SiOC) film, an organic material and the like, or as one having a lamination structure including two or more films thereof.

Further, using an ordinary resist coating, lithography and etching technologies, a wiring trench 453 is formed in the aforementioned fifth insulation film 45 in a portion where a bit line is to be formed in the memory cell region 6. At this time, no wiring trench is formed yet in the peripheral circuitry region 8. After that, the resist mask is no longer necessary and is removed.

After that, using a known film deposition technology, for example, sputtering, on the internal surface of the aforementioned wiring trench 453 and on the surface of the fifth insulation film 45, there are sequentially deposited a first barrier metal layer 55 and a magnetic material layer 521. The first barrier metal layer 55 may be any material provided that it inhibits reaction between copper and the magnetic material and also inhibits diffusion between the copper and the magnetic material. For example, tantalum (Ta), tantalum nitride (TaN), tungsten (W), tungsten nitride (WN) or the like are cited. Further, as the magnetic material layer 521, for example, a soft magnetic material having a maximum permeability $\mu_m$ in excess of 100 can be used, more specifically, for example, an alloy containing at least one of iron, cobalt and nickel, iron aluminum (FeAl) alloy, or a ferrite alloy can be used.

Subsequently, by a known etch-back technology, the magnetic material layer 521 and the first barrier metal layer 55 are etched anisotropically. As this etching gas, for example, a chlorine-containing halogen gas or the same gas further added with carbon oxide (CO) or ammonium (NH3) may be used. Still further, oxygen may be added thereto. For example, using a mixture gas as an etching gas mixed with chlorine (flow: 50 cm$^3$/min) and argon (flow: 50 cm$^3$/min), with a source power set at 600 W to 2 kW, a bias power at 50 W to 500 W, etching atmospheric pressure at 0.67 Pa to 1.3 Pa and a substrate temperature set at 20° C. to 60° C., etching is carried out. As a result, a side wall of the magnetic material layer 521 is formed on a side wall of the wiring trench 453 via the first barrier metal layer 55.

Further, by removing the stopper insulation film 451 exposed in the bottom of the wiring trench 453 by etching, for example, the surface of the cap layer 133 in the memory cell region 6 is exposed. As a process gas for etching this stopper insulation film 451, for example, a fluorine-containing gas is used. For example, using a mixture gas mixing chlorine (flow: 60 cm$^3$/min), boron trichloride (BCl$_3$) (flow: 90 cm$^3$/min) and trifluoro-methane (CHF$_3$) (flow: 5 cm$^3$/min), with a source power set at 600 W to 2 kW, a bias power at 50 W to 200 W, an etching atmospheric pressure at 1.3 Pa to 4.0 Pa and a substrate temperature set at 20° C. to 60° C., etching is carried out. As alternative etching gases, a mixed gas of trifluoromethane (CHF$_3$) and carbon monoxide (CO), a mixed gas of trifluoromethane (CHF$_3$), tetrafluoromethane (CF$_4$) and argon (Ar), a mixed gas of trifluoromethane (CHF$_3$), oxygen (O$_2$) and argon (Ar), or the like may be used.

Further, by sputtering, a second barrier metal layer 56 is deposited so as to cover the magnetic material layer 521 and a portion including the internal surface of the wiring trench 453. As the second barrier metal layer 56, a material that inhibits reaction with copper and diffusion of copper is required, and there are cited, for example, tantalum (Ta), tantalum nitride (TaN), tungsten (W), tungsten nitride (WN) and the like, and the metal may be the same material as the aforementioned first barrier metal layer 55 or a different material.

Further, after depositing a copper seed layer (not shown) on the surface of the second barrier metal layer 56, for example, by electrolytic plating, a conductive body (hereinafter referred to as copper film) is deposited so as to embed the wiring trench 453. This copper film is made, for example, from copper or a copper alloy. Thereby, inside the wiring trench 453 is embedded with the copper film, and, also, on the fifth insulation film 45 the copper film is formed via the second barrier metal layer 56. After that, by removing the copper film, the second barrier metal layer 56, the magnetic material layer 521, the first barrier metal layer 55 present on the second insulation film 42, for example, by chemical mechanical polishing (CMP), the second wiring 12 mainly made from the copper film having a trench wiring structure is formed. Therefore, only in the memory cell region 6, the second wiring (hereinafter referred to as a bit line) 12 orthogonally intersecting with the write word line (not shown) is formed via the aforementioned memory device 13 interposed therebetween.

Further, as illustrated in FIG. 4(2), in order to inhibit reaction with copper and diffusion of copper from the upper surface of the second wiring (including the bit line) 12, a third barrier metal layer 58 is formed, and then followed by deposition of a magnetic material layer 522 thereon. Further, an antireflection film (not shown) may be formed. As the third barrier metal layer 58, an insulation film such as silicon nitride (SiN), silicon carbide (SiC) and the like, or, as in the case of the first and the second barrier metal layers 55, 56, tantalum (Ta), tantalum nitride (TaN), tungsten (W), tungsten nitride (WN) or the like may be used. Further, as to the antireflection film, it is not indispensable if the influence of reflection from an underlayer is negligible during exposure in a subsequent lithography process. Here, a description will be made in the case where the antireflection film is not formed.

Further, using the conventional resist coating technology, a resist film (not shown) is formed on the magnetic material layer 522. Thereafter, using the lithography technology, a resist film is left only on a portion where a clad structure is desired to remain, that is, only above the portion where a TMR device is to be formed, and the resist film on the other portions is removed.

Subsequently, using the aforementioned resist film as an etching mask, by a known etching technology, the magnetic material layer 522 and the third barrier metal layer 58 are removed by etching. In this etching, using the fifth insulation film 45 as an etching stopper layer, etching is carried out. Accordingly, the magnetic material layer 52 comprising the magnetic material layer 521 which is formed into the aforementioned side wall and the aforementioned magnetic material layer 522 is formed on the upper surface as well as on the side surfaces of the bit line 12.

Further, as illustrated in FIG. 4(3), above the aforementioned fifth insulation film 45, there is formed a protective film 81 so as to encapsulate the aforementioned magnetic material layer 522. For this protective film 81, for example, an insulation film such as silicon nitride (SiN), silicon carbide (SiC) and the like can be used. Then, using conventional resist coating, lithographic and etching technologies, a wiring trench 454 is formed in the aforementioned protective film 81 and the fifth insulation film 45 in a region where second wiring in the peripheral circuitry region 8 is to be formed. As an etching gas for etching the protective film 81, a halogen gas containing, for example, chlorine, or the same further added with carbon monoxide (CO) or ammonium (NH$_3$) is used. Further, oxygen may be added to the gas. For etching of the fifth insulation film 45, in the case where the fifth insulation film 45 is made from a silicon oxide material, a conventional etching gas capable of etching silicon oxide materials, for example, a fluorine-containing gas, is used.

Subsequently, by removing a stopper insulation film 451 exposed to the bottom surface of the wiring trench 454 by etching, a surface of the plug 72 in the peripheral circuitry region 8 is exposed. As a process gas for etching this stopper insulation film 451, for example, a fluorine-containing gas is used.

At this time, although basically no wiring trench is formed in the memory cell region 6, in the case where wiring, a plug or the like which does not require a magnetic material layer on the side wall of the wiring within the memory cell region 6, a wiring trench thereof, a via hole or the like also can be formed. After that, the resist mask is no longer needed and is removed.

Subsequently, as illustrated in FIG. 4(4), using a known film deposition technology, for example, using a sputtering method, on the internal surface of the aforementioned wiring trench 454 and on the surface of the protective film 81, a barrier metal layer 82 is deposited. As the barrier metal layer 82, any material can be used provided that it inhibits reaction and diffusion between copper and the magnetic material. For example, tantalum (Ta), tantalum nitride (TaN), tungsten (W), tungsten nitride (WN) or the like are cited.

Further, after depositing a copper seed layer (not shown) on the surface of the barrier metal layer 82, for example, by electrolytic plating, a conductor (hereinafter referred to as a copper film) is deposited so as to embed the wiring trench 454. This copper film is made, for example, from a copper alloy. Thereby, inside the wiring trench 454 is embedded with the copper film, and, also, the copper film is deposited on the protective film 81 via the barrier metal layer 82. After that, by removing the copper film and the barrier metal layer 82 remaining on the protective film 81, for example, by a chemical mechanical polishing (CMP) method or the like, the second wiring 62 in the peripheral circuitry region 8 mainly made from the copper film having the trench wiring structure is formed. Therefore, in this process, only in the peripheral circuitry region 8, the second wiring 62 is formed.

In the method of manufacturing the aforementioned magnetic memory apparatus according to the second embodiment of the invention, the step of forming the second wiring 12 and 62 is comprised of a step of forming the second wiring (bit line) in the memory cell region 6 and a step of forming the second wiring in the peripheral circuitry region 8, wherein in the step of forming the bit line 12 in the memory cell region 6, because the bit line 12 is formed so as to have the magnetic material layer 52 made from a high magnetic permeability layer deposited on both side surfaces of the bit line 12 and on an upper surface opposite to a bottom surface thereof opposing the memory device 13 so that the utilization efficiency of the magnetic field generated by the bit line 12 is improved by use of the magnetic material layer 52, a structure capable of reducing a value of current for writing to the memory device 13 is provided. In addition, because the step of forming the bit line 12 in the memory cell region 6 and the step of forming the second wiring 62 in the peripheral circuitry region 8 are carried out by a different process, the magnetic material layer 52 for cladding the bit line 12 can be formed only within the memory cell region 6 and is not formed in the peripheral circuitry region 8 outside thereof. Therefore, for the second wiring 62 in the peripheral circuitry region 8, a higher integration of wiring becomes possible corresponding to a portion without forming the magnetic material layer for cladding the wiring. That is, for the second wiring 62 in the peripheral circuitry region 8, because the magnetic material layer 522 is not formed immediately thereupon, there is no need to consider a deviation margin for alignment with the magnetic material layer 522 in the peripheral circuitry region 8. As a result, the second wiring 62 in the peripheral circuitry region 8 can be designed in a minimal design dimension, accordingly, enabling a higher integration. In other words, because a reduced wiring area due to the formation of the magnetic material layer can be eliminated, accordingly, a wiring area can be increased that much, thereby reducing a wiring resistance. Thereby, a wiring structure capable of reducing power consumption and heat generation is formed. Further, a signal delay is suppressed, and a faster response becomes possible.

Next, a method of manufacturing the magnetic memory apparatus according to a third embodiment of the present invention will be described by referring to FIG. 5, which illustrates a manufacturing process in cross sections. In this third embodiment, a method of manufacturing the second wiring (bit line) according to a feature of the present invention will be described in detail. By way of example, diagrams on the left-hand side of the drawing indicates a memory cell region 6 and diagrams on the right-hand side thereof indicates a peripheral circuitry region 8.

By a known technology, for example, on s semiconductor substrate, a device isolation region for isolating between respective device-forming regions in a memory cell region 6 and between respective device-forming regions in a peripheral circuitry region 8 is formed, and then a switching device for read-out is formed in a device-forming region in the memory cell region 6. This switching device can be formed with a variety of types of switching devices, such as n-type or p-type field effect transistors, diodes, bipolar transistors and the like. Also, in the peripheral circuitry region 8, desired devices, wiring and the like are formed.

A first insulation film is formed so as to encapsulate the aforementioned field effect type transistors, the peripheral circuitry region 8 and the like, and then, for example, a contact (e.g. a tungsten plug) that is to be connected to an underlayer device, wiring or the like of the aforementioned switching device or the like is formed in the first insulation film. Further, on the first insulation film, a sense line, a connection electrode and the like to be connected to the contact are formed.

On the aforementioned first insulation film, a second insulation film is formed. The second insulation film in the memory cell region 6 covers the aforementioned sense line, the connection electrode and the like. Further in the second insulation film, a contact (e.g. a tungsten plug) to be connected to the aforementioned connection electrode is formed.

Subsequently, a third insulation film is formed on the aforementioned second insulation film. Next, by the method described with reference to FIG. 3 or by a conventional method of forming a write word line, first wiring (write word line) is formed in the third insulation film. According to the method described with reference to FIG. 3, after having formed the first wiring (write word line) in the memory cell region 6, first wiring is formed in the peripheral circuitry region 8. According to the conventional method of forming the write word line, the first wiring (write word line) is formed simultaneously both in the memory cell region 6 and the peripheral circuitry region 8. The former method is preferred. Thereafter, further, a third insulation film is formed so as to clad the first wiring. By way of example, it is also possible simultaneously to form a plug, a connection electrode and the like in the memory cell region 6 in the same process as the one in which the first wiring is formed in the peripheral circuitry region 8.

Figure 5A:
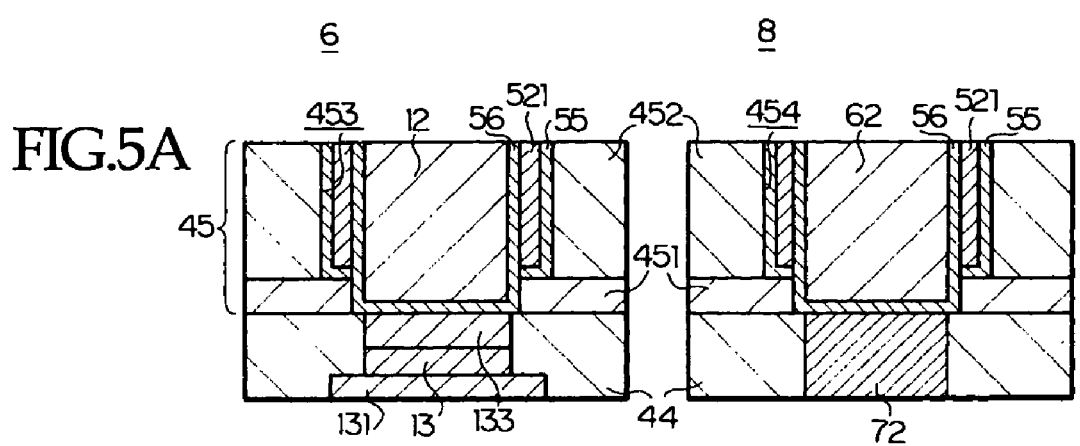
FIG. 5 is a schematic diagram showing a process of manufacturing a magnetic memory apparatus in cross sections according to a third embodiment of the present invention.
Figure 5B:
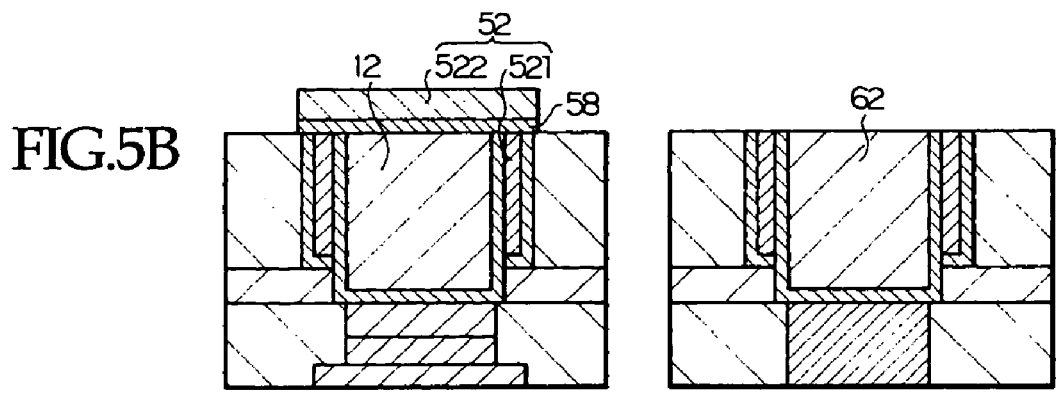
Figure 6:
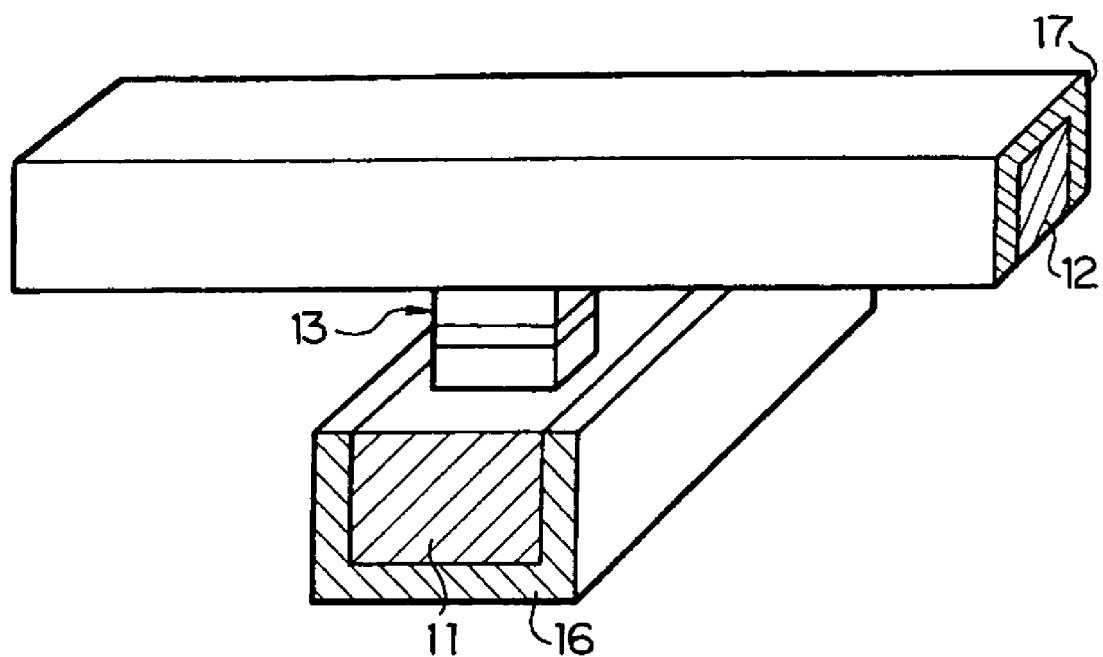
FIG. 6 is a perspective, schematic view showing a simplified MRAM in part which uses a clad structure formed from a magnetic material layer.

As illustrated in FIG. 5(1), subsequently, on the third insulation film (not shown), there are formed a conductive layer 131, a magnetoresistance-effect-type memory device (e.g. a TMR device) 13, and a conductive cap layer (protective metal layer) 133. Further, a fourth insulation film 44 is formed so as to embed the memory device 13, the cap layer 133 and the like. Later on, by chemical mechanical polishing, the upper surface of the cap layer 133 is exposed, and also, the surface of the fourth insulation film 44 is planarized. The processing described above can be carried out by existing methods and is not limited to the aforementioned process. Further, using a conventional method of forming a plug for connecting between an upper layer wiring and a lower layer wiring, a plug for connecting to the lower layer wiring or electrode can be formed through the fourth insulation film 44 as well. Here, as illustrated in the drawing, a plug 72 is formed as an example in the peripheral circuitry region 8. For forming this plug 72, a conventional method of forming the plug can be used.

Further, an etching stopper layer 451 is formed on the fourth insulation film 44, and an interlayer insulation film 452 is formed thereon, thereby forming a fifth insulation film 45. The stopper insulation film 451 is made from an insulation film whereupon etching can be stopped when etching the fifth insulation film 45, which is made of, for example, a silicon nitride (SiN) film, a silicon carbide (SiC) film or the like. The aforementioned fifth insulation film 45 is formed as an insulation material film of, for example, a silicon oxide ($SiO_2$) film, a fluorine-containing silicon oxide (SiOF) film, a silicon oxide carbon (SiOC) film, an organic compound film and the like, or as a lamination structure using two or more of the above.

Further, using conventional resist coating, lithographic and etching technologies, wiring trenches 453, 454 are formed in a region where bit lines are to be formed in the fifth insulation film 45 in the memory cell region 6 and the peripheral circuitry region 8. After that, the resist mask is no longer needed and is removed.

Subsequently, using a known film deposition method, for example, using sputtering, on the internal surface of the wiring trenches 453, 454 and on the surface of the fifth insulation film 45, there are deposited sequentially a first barrier metal layer 55 and a magnetic material layer 521. The first barrier metal layer 55 may be any material provided that it inhibits reaction between copper and a magnetic material as well as inhibits diffusion between copper and the magnetic material. For example, tantalum (Ta), tantalum nitride (TaN), tungsten (W), tungsten nitride (WN) and the like are cited. Further, as the magnetic material film 521, for example, a soft magnetic material having a maximum permeability $\mu_m$ in excess of 100 can be used, and more specifically, as an example, an alloy containing at least one of iron, cobalt and nickel, an iron-aluminum (FeAl) alloy or a ferrite alloy is used.

Further, by a known etch-back method, the magnetic material layer 521 and the first barrier metal layer 55 are subjected to anisotropic etching. As this etching gas, for example, a chlorine-containing halogen gas or the same gas further containing carbon monoxide (CO) or ammonium ($NH_3$) added thereto is used. Further, oxygen may be added thereto. For example, the same etching gas as used in the anisotropic etching of the magnetic material layer 521 and the first barrier metal layer 55 set forth in the above description of the second embodiment was used. As a result, a side wall of the magnetic material layer 521 is formed on the side walls of the wiring trenches 453, 454 via the first barrier metal layer 55.

Next, by removing by etching the stopper insulation film 451 exposed to the bottom of the wiring trenches 453, 454, for example, the surface of the cap layer 133 in the memory cell region 6 and the surface of the plug 72 in the peripheral circuitry region 8 are exposed. As a process gas for etching this stopper insulation film 451, for example, a fluorine-containing gas is used. For example, the same gas as the etching gas used for the stopper insulation film 451 described above in the second embodiment is used.

Further, by the sputtering method, a second barrier metal layer 56 is deposited so as to cover the magnetic material layer 521 including each internal surface of the wiring trenches 453, 454. As the second barrier metal layer 56, a material is required which inhibits reaction with copper and diffusion of copper. For example, tantalum (Ta), tantalum nitride (TaN), tungsten (W), tungsten nitride (WN) and the like are cited. It may be the same material as the aforementioned barrier metal layer 55 or a different material.

Further, after having deposited a copper seed layer (not shown) on the surface of the second barrier metal layer 56, for example, by electrolytic plating, a conductor material (hereinafter referred to as a copper film) is deposited so as to embed the wiring trench 453, 454. This copper film is made from, for example, copper or a copper alloy. Thereby, inside the wiring trench 453, 454 is embedded with the copper film, and also on the fifth insulation film 45, the copper film is formed via the second barrier metal layer 56. After that, by removing the copper film on the second insulation film 42, the second barrier metal layer 56, the magnetic material layer 521, the first barrier metal layer 55, for example, by chemical mechanical polishing (CMP) method or the like, the second wiring 12, 62 having the copper film of the trench wiring structure as its main material are formed.

Further, as illustrated in FIG. 5(2), in order to prevent reaction and diffusion of copper from the upper surface of the second wiring (including the bit line), a third barrier metal layer 58 is formed, and then followed by deposition of a magnetic material layer 522. Further, an antireflection film (not shown) may be formed. As the third barrier metal layer 58, for example, an insulation film such as silicon nitride (SiN), silicon carbide (SiC) may be used, or as in the first and the second barrier metal layers 55, 56, tantalum (Ta), tantalum nitride (TaN), tungsten (W), tungsten nitride (WN) or the like may be used as well. Further, the magnetic material layer 522 can be formed from the same material as the above-mentioned magnetic material layer 521. By way of example, as for the antireflection film, it is not indispensable in the case where an effect of reflection from the underlayer at the time of exposure in a subsequent lithographic process does not matter. Here, such a case where no antireflection film is formed will be described.

Further, using the conventional resist coating technology, a resist film (not shown) is formed on the magnetic material layer 522. Subsequently, by lithographic technology, leaving the resist film only on an upper portion corresponding to a portion where a clad structure is desired to remain, that is, the portion where a TMR device is to be formed, the resist film on the other portions is removed.

After that, using the above-mentioned resist film as an etching mask, by the known etching technology, the magnetic material layer 522 and the third barrier metal layer 58 are removed by etching. This etching is carried out by using the fifth insulation film 45 as the etching stopper layer. Thereby, the magnetic material layer 52 comprising the magnetic material layer 521 that is formed in the shape of the side wall and the aforementioned magnetic material layer 522 is formed on the upper surface and side walls of the bit line 12. By way of example, in the case where the third barrier metal layer 58 is made from an insulation film, it may be left on the peripheral circuitry region 8. Further, in the case where no barrier metal layer is formed on the second wiring 62 in the peripheral circuitry region 8 by the above-mentioned process, it is desirable to form a barrier metal layer to cover the second wiring 62 in the peripheral circuitry region 8 by a different process.

According to the method of manufacturing the magnetic memory apparatus according to the third embodiment, at the time of forming the wiring trench 453 for forming the second wiring (bit line) 12 in the fifth insulation film 45, etching is stopped by the stopper insulation film 451 which covers the cap layer 133. Then, after sequentially forming the first barrier metal layer 55 and the magnetic material layer 521 on the internal wall of the wiring trench 453 and on the surface of the fifth insulation film 45, the magnetic material layer 521, the first barrier metal layer 55 and the stopper insulation film 451 in the bottom of the wiring trench 453 are removed to expose the upper surface of the cap layer 133; and also the magnetic material layer 521 and the first barrier metal layer 55 on the fifth insulation film 45 are removed, so that the side wall of the magnetic material layer 521 is formed along the side wall of the wiring trench 453 via the first barrier metal layer 55. At this time, the upper surface of the cap layer 133 above the memory device 13 is exposed in the bottom of the wiring trench 453. Then, after embedding a copper film (conductor) which is a main material of the wiring in the wiring trench 453 via the second barrier metal layer 56, the copper film and the second barrier metal layer 56 on the fifth insulation film 45 are removed, so that the second wiring (bit line) 12 made from a copper film is formed inside the wiring trench 453. As a result, the second wiring 12 in the memory cell region 6 is connected to the cap layer 133 on the upper side of memory device 13 via the second barrier metal layer 56, and the second wiring 62 in the peripheral circuitry region 8 is connected to the plug 72 via the second barrier metal layer 56. By the above-mentioned processing, and by the trench wiring deposition technology, the magnetic material layer 55 for cladding the side wall of the second wiring 12 can be formed easily.

Still further, because after having formed the third barrier metal layer 58 on the fifth insulation film 45 for cladding the bit line 12 in the memory cell region 6, a magnetic material layer 522 is formed, and then a patterning is carried out such that the magnetic material layer 522 and the third barrier metal layer 58 are selectively left on the bit line 12, the side wall and the upper surface of the bit line 12 are almost clad by the magnetic material layer 521 formed on the side wall thereof and the aforementioned magnetic material layer 522 formed thereon.

Moreover, the magnetic material layer 522 is not formed on the second wiring 62 in the peripheral circuitry region 8. Therefore, although the magnetic material layer 521 is formed on the side wall of the second wiring 62 in the peripheral circuitry region 8, because the second wiring 62 does not have the magnetic material layer 522 formed immediately thereupon, there is no need to consider any alignment deviation margin with the magnetic material layer 522 in the peripheral circuitry region 8. As a result, because the second wiring 62 in the peripheral circuitry region 8 can be formed in a minimal design dimension, a higher integration becomes possible.

The method of forming the second wiring in the peripheral circuitry region may also include the following method besides the aforementioned methods.

For example, in the second embodiment in the method of manufacturing the magnetic memory apparatus described above, after having formed the protective film 81 covering the bit line 12 in the memory cell region 6, the second wiring 62 is formed in the peripheral circuitry region 8 in the same manner as described in the second embodiment. After that, by removing the protective film 81 on the bit line 12 in the memory cell region 6, and by forming a barrier metal layer 62 and a magnetic material layer 522 such as to cover the bit line 12 in the memory cell region 6 and the second wiring 62 in the peripheral circuitry region 8, patterning of the barrier metal layer 82 and the magnetic material layer 522 into the shapes of the bit line 12 and the second wiring 62 may be performed.

In each embodiment described hereinabove, only the structure of the trench wiring is described, however, it is not limited thereto, and the scope of the invention also includes such a structure in which a trench wiring and a connection hole to be formed in the bottom thereof are formed in a simultaneous process, i.e., a so-called dual damascene structure, or regardless of the shapes of the wiring structure. Further, in order to communicate with the cap layer 133 of the memory device, a communicating hole or the like may exist.

In each embodiment described hereinabove, the process which used the first, the second barrier metal layers 55, 56, and the barrier metal layer 82 was described. However, the first and the second barrier metal layers 55, 56 and the barrier metal layer 82 may be omitted provided that the first wiring 11 is clad by the magnetic material layer 51 except for the surface thereof facing the memory device 13 and that the second wiring 12 is clad by the magnetic material layer 52 except for the surface thereof facing the memory device 13.

In each embodiment described hereinabove, the barrier metal layers to be formed on the bit line 12 and the second wiring 62 may also be formed using, for example, a cobalt-tungsten-phosphor (Co—W—P) film. In this case, because its method of formation is a substitution plating for substituting with the wiring material, the magnetic material layer 522 to be formed subsequently in the memory cell region and the magnetic material layer 521 formed on the side wall of the wiring are formed in contact therebetween, thereby improving the efficiency of application of a current magnetic field to the memory device 13, and thereby enabling writing with a reduced current.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A magnetic memory apparatus including a memory cell region and a peripheral circuitry region mounted on a substrate, wherein:
   the memory cell region comprises
   first wiring,
   second wiring that three-dimensionally intersects with the first wiring, and
   a magnetoresistance effect type memory device disposed in an intersecting region of the first and the second wiring for storing and reproducing information of a magnetic spin;
   the peripheral circuitry region comprises
   first wiring that is in the same wiring layer as that of the first wiring in the memory cell region,
   second wiring that is in the same wiring layer as the second wiring in the memory cell, and
   a magnetic material layer including a high magnetic permeability layer is formed on both side surfaces of the first wiring only within the memory cell region and on a surface opposite to a surface facing the memory device.

2. A magnetic memory apparatus including a memory cell region and a peripheral circuitry region mounted on a substrate, wherein:
   the memory cell region comprises
   first wiring,
   second wiring that three-dimensionally intersects with the first wiring, and
   a magnetoresistance effect type memory device disposed in an intersecting region of the first and the second wiring for storing and reproducing information of a magnetic spin;
   the peripheral circuitry region comprises
   first wiring that is in the same wiring layer as that of the first wiring in the memory cell region,
   second wiring that is in the same wiring layer as the second wiring in the memory cell, and
   a magnetic material layer including a high magnetic permeability layer is formed on both side surfaces of the second wiring only within the memory cell region and on a surface opposite to a surface facing the memory device.

3. The magnetic memory apparatus according to claim 1, wherein:
   a magnetic material layer including a high magnetic permeability layer is formed on both side surfaces of the second wiring only within the memory cell region and on a surface opposite to a surface facing the memory device.

4. The magnetic memory apparatus according to claim 2, wherein:
   a magnetic material layer including a high magnetic permeability layer is formed on a part of surface of the second wiring within peripheral circuitry region.

* * * * *